(12) United States Patent
Fukuhara

(10) Patent No.: US 11,333,970 B2
(45) Date of Patent: May 17, 2022

(54) IMPRINT DEVICE, IMPRINT METHOD AND METHOD OF MANUFACTURING SEMICONDUCTOR DEVICE

(71) Applicant: Kioxia Corporation, Tokyo (JP)

(72) Inventor: Kazuya Fukuhara, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 257 days.

(21) Appl. No.: 16/285,649

(22) Filed: Feb. 26, 2019

(65) Prior Publication Data

US 2020/0081338 A1 Mar. 12, 2020

(30) Foreign Application Priority Data

Sep. 7, 2018 (JP) .............................. JP2018-167679

(51) Int. Cl.
*G03F 7/00* (2006.01)
*H01L 21/027* (2006.01)
*B29C 43/52* (2006.01)
*B29C 35/08* (2006.01)

(52) U.S. Cl.
CPC ........ *G03F 7/0002* (2013.01); *B29C 35/0805* (2013.01); *B29C 43/52* (2013.01); *H01L 21/0274* (2013.01)

(58) Field of Classification Search
CPC ... B29C 35/0805; B29C 43/52; G03F 7/0002; H01L 21/0274
See application file for complete search history.

(56) References Cited

U.S. PATENT DOCUMENTS

| 8,864,489 B2 | 10/2014 | Landis et al. |
| 9,201,298 B2 | 12/2015 | Nakagawa et al. |
| 2017/0282419 A1 | 10/2017 | Hayashi et al. |

FOREIGN PATENT DOCUMENTS

| JP | 5268524 B2 | 8/2013 |
| JP | 5416163 B2 | 2/2014 |
| JP | 5995567 B2 | 9/2016 |
| JP | 2017-188556 A | 10/2017 |

*Primary Examiner* — Robert J Grun
(74) *Attorney, Agent, or Firm* — Foley & Lardner LLP

(57) ABSTRACT

An imprint device, including a template which has a first surface and a second surface opposite to the first surface, and is provided with a pedestal portion on the first surface, the pedestal portion defining a pattern; a holding portion configured to hold the template; and a magnification adjustment unit disposed at a position corresponding to the pattern of the pedestal portion on a second surface side of the template without contacting the template.

21 Claims, 12 Drawing Sheets

(a)

(b)

IMPRINT DEVICE, IMPRINT METHOD AND METHOD OF MANUFACTURING SEMICONDUCTOR DEVICE

CROSS-REFERENCE TO RELATED APPLICATION

This application claims the benefit of and priority to Japanese Patent Application No. 2018-167679, filed Sep. 7, 2018, the entire contents of which are incorporated herein by reference.

FIELD

Embodiments described herein relate generally to an imprint device, an imprint method and a method of manufacturing a semiconductor device.

BACKGROUND

In imprint lithography used in a semiconductor process, a pattern of a pedestal portion is transferred to a photosensitive material on a substrate by pressing the pedestal portion (mesa portion) of a template against the photosensitive material on the substrate. In order to prevent displacement between layers, it is desirable to effectively adjust the magnification of the template.

DETAILED DESCRIPTION

Figure 1:
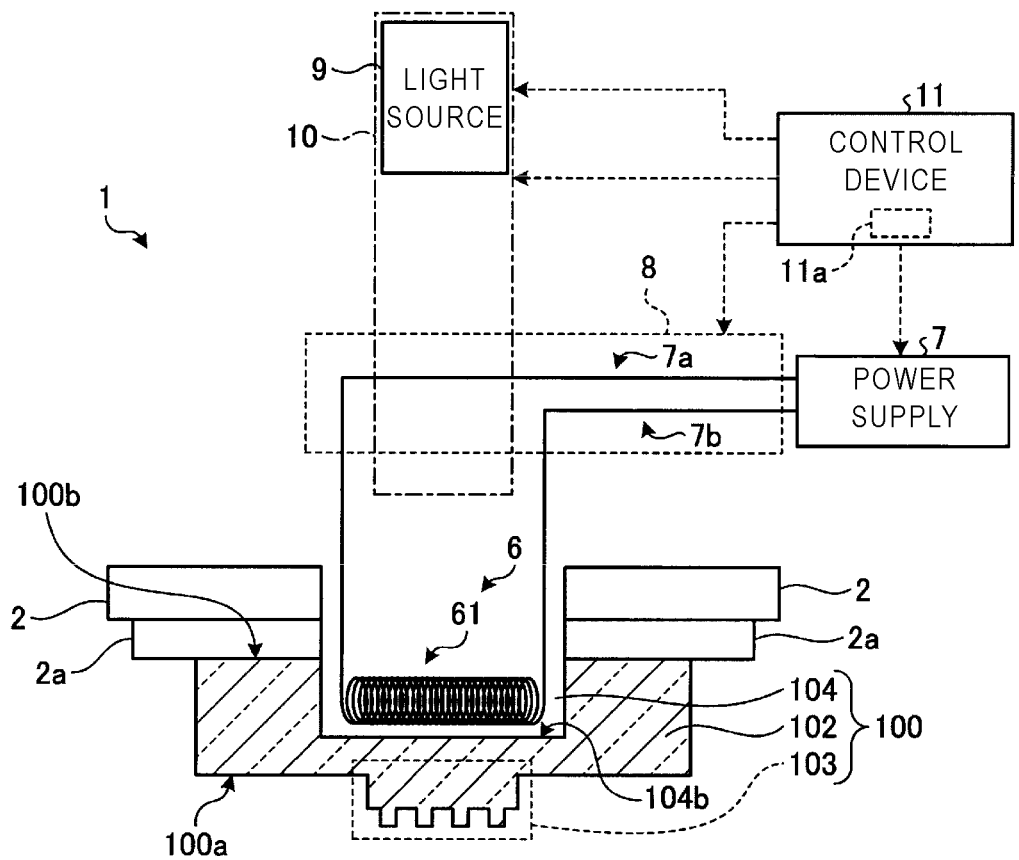
FIG. 1 is a view showing a configuration of an imprint device according to a first embodiment.
Figure 1:
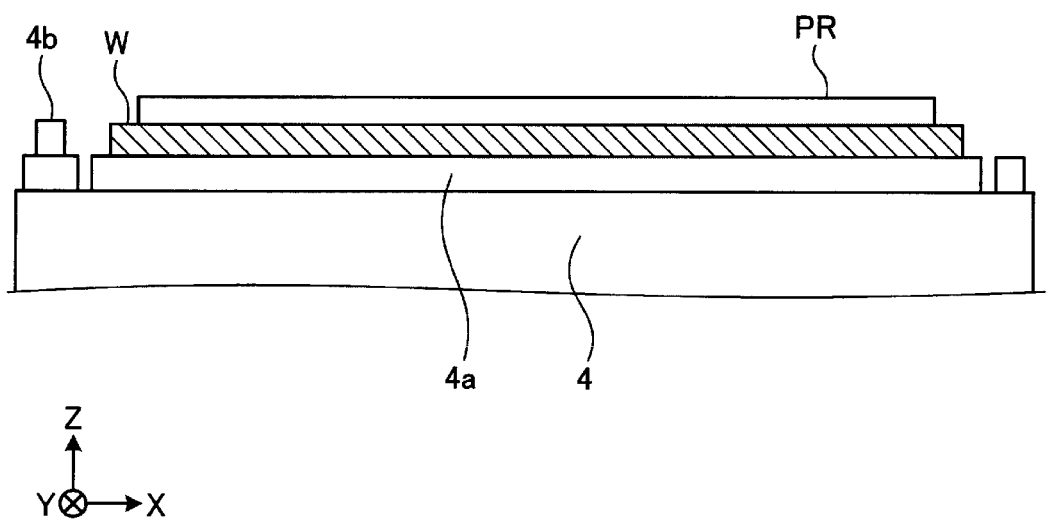

One embodiment provides an imprint device, an imprint method and a method of manufacturing a semiconductor device which can effectively adjust the magnification of a template.

In general, according to one embodiment, there is provided an imprint device including a template, a holding portion and a magnification adjustment unit. The template has a first surface and a second surface opposite to the first surface, and is provided with a pedestal portion on the first surface, the pedestal portion defining a pattern. The holding portion is configured to hold the template. The magnification adjustment unit is disposed at a position corresponding to the pattern of the pedestal portion on a second surface side of the template without contacting the template.

Hereinafter, an imprint device according to embodiments will be described in detail with reference to the attached drawings. It should be noted that the present disclosure is not limited by these embodiments.

First Embodiment

An imprint device according to a first embodiment is used in semiconductor process technology, for example, used in a lithography process using nanoimprint technology. When using the nanoimprint technology in manufacturing of a semiconductor device, it is desirable to achieve sufficient overlay accuracy. For example, when an original pattern is stamped onto a substrate, it is desirable to precisely match the magnification of the original pattern formed on a pedestal portion (mesa portion) of a template with the magnification of a lower layer pattern previously formed on the substrate (for example, a wafer). The above magnification is also referred to as shot magnification.

Accordingly, in order to adjust the shot magnification of the original pattern of the template during imprinting, a first method is conceivable that the pedestal portion is deformed by applying a force to a lateral surface of the template to deform the template. Alternatively, in order to adjust the shot magnification of the substrate during imprinting, a second method is conceivable that the substrate, not the template, is locally heated and deformed by irradiating the substrate with visible light via the template.

In the first method and the second method, the adjustment range of the magnification of the template tends to be narrow in an actual semiconductor process. In order to precisely match the shot magnification of the original pattern and the shot magnification of the lower layer pattern, a template magnification adjusting method capable of achieving a wider adjustment range is desired.

In addition, a third method is conceivable in which an original stage which contacts a peripheral region on a rear surface of the template is heated and the heat is transferred from the original stage to the template so as to heat and deform the template.

In the third method, there is a distance from the original stage to the pedestal portion, and thus the responsiveness of heating to the pedestal portion may be low and the magnification adjustment time may be long.

In the first embodiment, the imprint device has a magnification adjustment unit that is disposed at a position corresponding to a pattern of the pedestal portion on the back surface side of the template without contacting the template, so that the pedestal portion can be thermally deformed by radiation heat from the magnification adjustment unit, which can expand the adjustment range and shorten the adjustment time.

In the embodiment, the template may be provided with an opening (core-out portion or recess portion) on the back surface side opposite to the surface on which the pedestal portion (mesa portion) is disposed. The imprint device is provided with an electromagnetic wave generation source as the magnification adjustment unit in a non-contact manner in the vicinity of a bottom surface of the opening. The electromagnetic wave generation source can generate electromagnetic waves with a wavelength longer than visible light, for example, electromagnetic waves (such as infrared rays and far infrared rays) suitable for radiation heating. The imprint device irradiates the pedestal portion with electromagnetic waves from the electromagnetic wave generation source. Since the pedestal portion can be heated substantially uniformly and thermally deformed by the radiation heating, the range of the magnification adjustment can be readily expanded. When the template is formed of a material containing fused quartz as a main component (i.e., is composed over about 50% by weight of the material, such as about 60% or more, or about 70% or more), a change of about 0.5 ppm in magnification can be caused by a change of about 1° C. in temperature. In addition, since it is possible to heat from a position close to the pedestal portion by the radiation heating, the responsiveness of heating to the pedestal portion can be readily improved and the magnification adjustment time can be readily shortened.

For example, an imprint device 1 may be configured as shown in FIG. 1. FIG. 1 is a view showing a configuration of the imprint device 1 and shows a sectional configuration when the imprint device 1 is viewed from the Y axis direction. In the present embodiment, a surface on which a substrate W is placed is an XY plane, and an upper surface of the substrate W crosses the Z axis substantially perpendicularly. The substrate W is, for example, a semiconductor substrate and may be formed of a material containing a semiconductor such as silicon as a main component.

The imprint device 1 includes an original stage 2, a substrate stage 4, a magnification adjustment unit 6, a power supply 7, an operation unit 8, a light source 9, an operation unit 10 and a control device 11.

The original stage 2 holds a template 100. The original stage 2 includes an original chuck 2a such as an electrostatic chuck or a vacuum chuck, and can suck and hold the template 100 by using the original chuck 2a. The original stage 2 may be movable in an XY direction, an XYZ direction, an $XY\theta_Z$ direction or an $XYZ\theta_Z$ direction. The $\theta_Z$ direction is a rotation direction around the Z axis. The original stage 2 and/or the original chuck 2a may constitute a holding portion configured to hold the template 100.

The template 100 includes a template main body 102, a pedestal portion 103 and an opening 104. The template main body 102 includes a surface 100a and a back surface 100b, and the pedestal portion 103 is disposed on the surface 100a. The pedestal portion 103 is raised in a pedestal shape from the surface 100a of the template main body 102. The pedestal portion 103 is a portion formed by the mesa processing and is also called a mesa portion. The pedestal portion 103 includes an uneven pattern corresponding to a pattern to be transferred to the substrate W. The template main body 102 is provided with the opening 104 on the back surface 100b. The opening 104 is a portion, formed by core-out processing (or counterboring processing), of a substrate to be the template main body 102, and is also called a core-out portion (or counterbored portion, or recess portion). The original stage 2 can hold a position which does not interfere with the opening 104 (e.g., does not block the opening 104).

An alignment sensor (not shown) may be disposed on the original stage 2. The alignment sensor may be used for detecting a position of the substrate W and detecting a position of the template 100.

The substrate stage 4 holds the substrate W with the substrate W being displaced thereon. The substrate stage 4 includes a substrate chuck 4a such as an electrostatic chuck or a vacuum chuck, and can suck and hold the substrate W by using the substrate chuck 4a. The substrate stage 4 is provided with a reference mark 4b thereon. The reference mark 4b is a mark used for detecting the position of the substrate stage 4 and for alignment when the substrate W is loaded onto the substrate stage 4. The substrate stage 4 may be movable in the XY direction, the XYZ direction, the $XY\theta_Z$ direction, an $XYZ\theta_Z$ direction or an $XYZ\theta_X\theta_Y\theta_Z$ direction. The $\theta_Z$ direction is a rotation direction around the Z axis. The $\theta_X$ direction is a rotation direction around the X axis. The $\theta_Y$ direction is a rotation direction around the Y axis.

The magnification adjustment unit 6 may be disposed at a position corresponding to (e.g., disposed above) the pattern of the pedestal portion 103 on a back surface 100b side of the template 100 without contacting the template 100. The magnification adjustment unit 6 includes an electromagnetic wave generation source 61. The electromagnetic wave generation source 61 generates electromagnetic waves with a wavelength longer than visible light.

Figure 2:
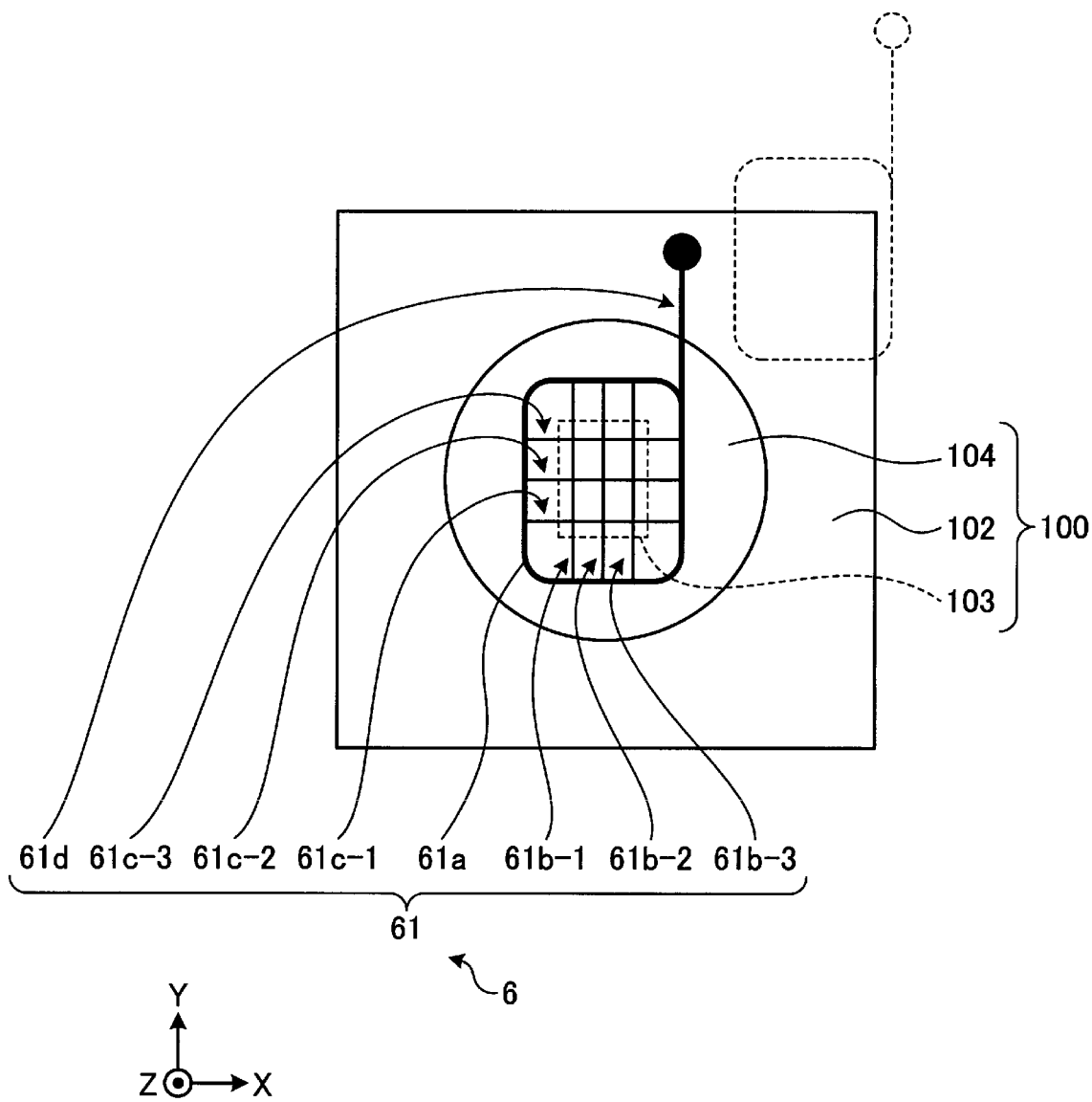
FIG. 2 is a view showing a planar configuration of a magnification adjustment unit according to the first embodiment.

For example, the magnification adjustment unit 6 may be configured as shown in FIG. 2. FIG. 2 is a view showing a planar configuration of the magnification adjustment unit 6. The electromagnetic wave generation source 61 in the magnification adjustment unit 6 includes a frame 61a, a plurality of heating wires 61b-1 to 61b-3, a plurality of heating wires 61c-1 to 61c-3 and a grip portion 61d. The frame 61a includes a tubular member having a substantially rectangular shape in an XY plane view. The grip portion 61d is a tubular member which is in communication with the tubular member in the frame 61a, extends in the Z direction, and is gripped by an operation unit 8. The plurality of heating wires 61b-1 to 61b-3 extend in the Y direction so as to overlap the pedestal portion 103 in the XY plan view, and first ends and second ends are electrically connected to the power supply 7 (see FIG. 1) through the tube of the frame 61a and the tube of the grip portion 61d respectively. Similarly, the plurality of heating wires 61c-1 to 61c-3 extend in the X direction so as to overlap the pedestal portion 103 in the XY plane view, and first ends and second ends are electrically connected to the power supply 7 (see FIG. 1) through the tube of the frame 61a and the tube of the grip portion 61d respectively.

The power supply 7 shown in FIG. 1 can supply electric power to the magnification adjustment unit 6 via wirings 7a and 7b. For example, the power supply 7 supplies electric power to the electromagnetic wave generation source 61 in a state (first state) where the electromagnetic wave generation source 61 is disposed in a non-contact manner in the vicinity of a bottom surface 104b of the opening 104 (e.g., is disposed completely within the opening 104 without contacting the bottom surface 104b of the opening 104). Accordingly, the electromagnetic wave generation source 61 (each of the heating wires 61b and heating wires 61c) can generate electromagnetic waves (such as infrared rays and far infrared rays) suitable for radiation heating. The pedestal portion 103 can be substantially uniformly heated by the radiation heating.

The operation unit 8 switches between a first state and a second state. The first state is a state where the magnification adjustment unit 6 is disposed at a position corresponding to the pattern of the pedestal portion 103 in the opening 104. The position corresponding to the pattern of the pedestal portion 103 in the opening 104 may be, for example, a position in the vicinity of the bottom surface 104b without contacting the template 100. The second state is a state where the magnification adjustment unit 6 is retracted from the opening 104.

For example, the operation unit 8 moves the electromagnetic wave generation source 61 shown in FIG. 2 in the XY direction up to a position above the template 100 on a +Z side, and can switch to the first state by pushing down the electromagnetic wave generation source 61 in the −Z direction via the grip portion 61d to move to the position in the vicinity of the bottom surface 104b in the opening 104 of the template 100 without contacting the template 100. When the electromagnetic wave generation source 61 shown in FIG. 2 is disposed at the position in the vicinity of the bottom surface 104b in the opening 104 of the template 100 without contacting the template 100, the operation unit 8 can switch to the second state by pulling up the electromagnetic wave generation source 61 in the +Z direction via the grip portion 61d to move the electromagnetic wave generation source 61 in the XY direction to a position (for example, a right end position shown by a broken line) outside the opening 104 of the template 100 without overlapping the pedestal portion 103 when viewed from the Z direction. By switching to the second state, it is possible to expose the substrate W and observe an alignment mark via the template 100.

The light source 9 shown in FIG. 1 is a light source which emits exposure light such as UV light and is provided above the original stage 2. For a photosensitive material PR, for example, a photocurable resin such as resist may be used. In a state where the template substrate 100 is pressed against the photosensitive material PR, the light source 9 irradiates the photosensitive material PR with exposure light from above the transparent template substrate 100.

The operation unit 10 switches between a third state and a fourth state. The third state is a state where the light source 9 is retracted to a position (for example, a position in the vicinity of an upper end of a region surrounded by the dashed-dotted line in FIG. 1) which does not interfere with (e.g., does not contact, or is not disposed below) the wirings which connect the magnification adjustment unit 6 and the power supply 7. The fourth state is a state where the light source 9 is disposed at a position (for example, a position in the vicinity of a lower end of the region surrounded by the dashed-dotted line in FIG. 1, or disposed between the wirings and the template 100, or disposed below the wirings) in the vicinity of the opening 104 in the template 100.

Figure 3:
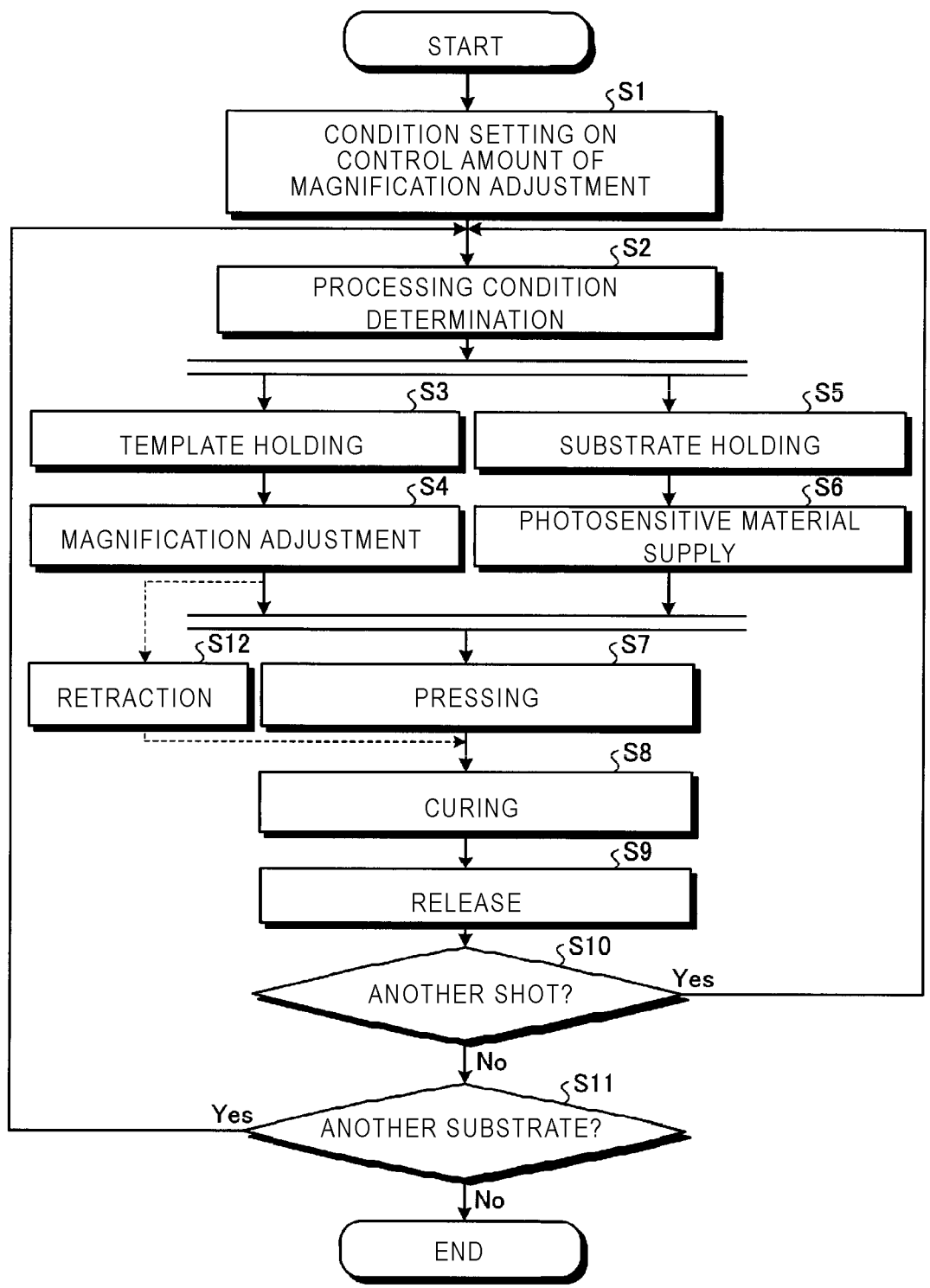
FIG. 3 is a flowchart showing a method of manufacturing a semiconductor device using the imprint device according to the first embodiment.
Figure 4:
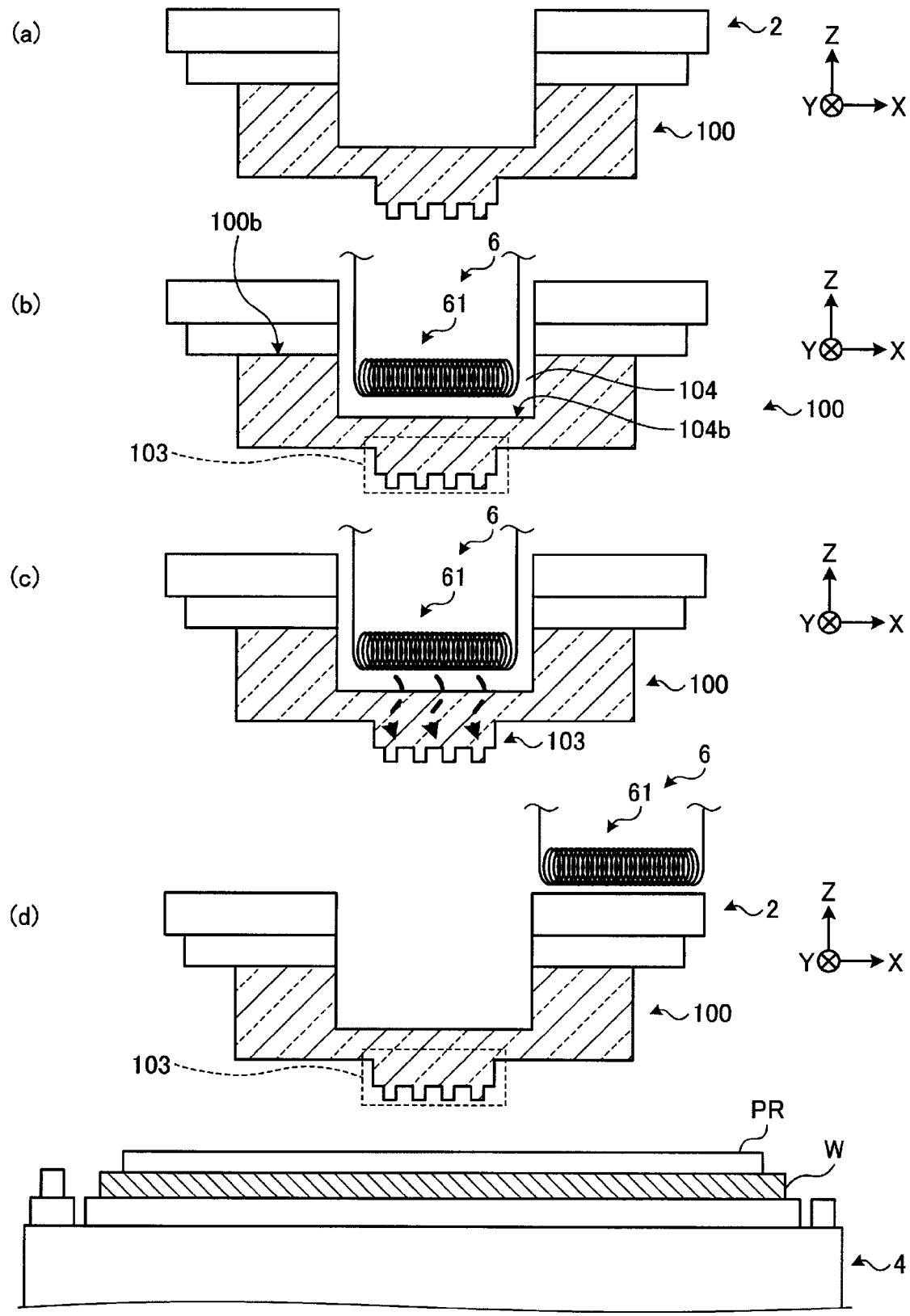
FIG. 4 is a view showing an operation of the imprint device according to the first embodiment.
Figure 5:
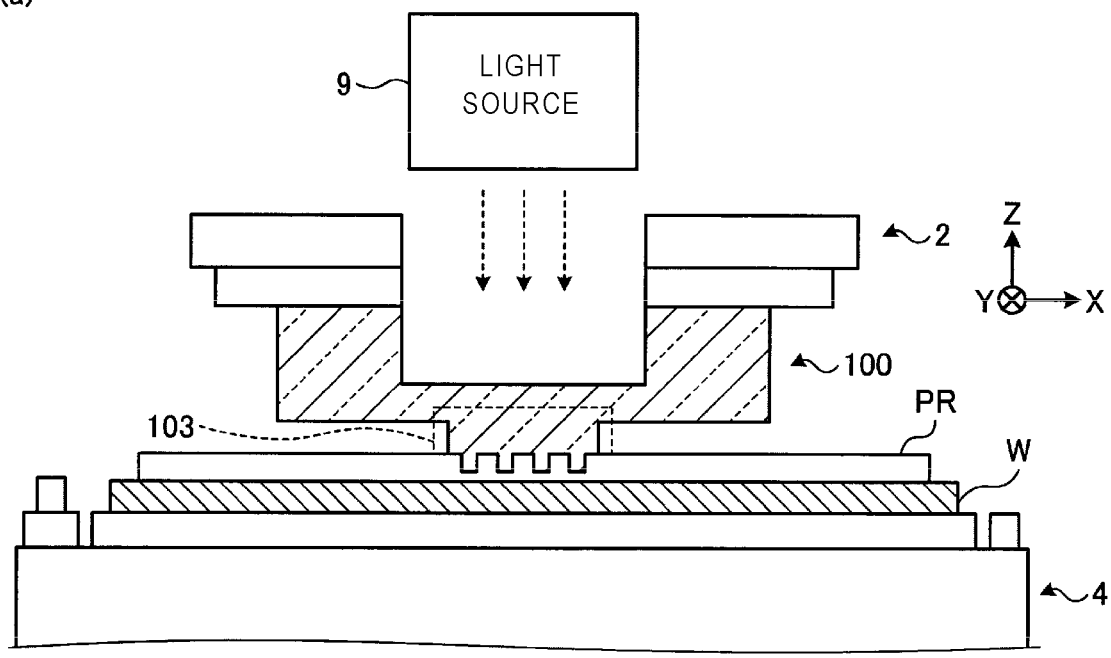
FIG. 5 is a view showing an operation of the imprint device according to the first embodiment.
Figure 5:
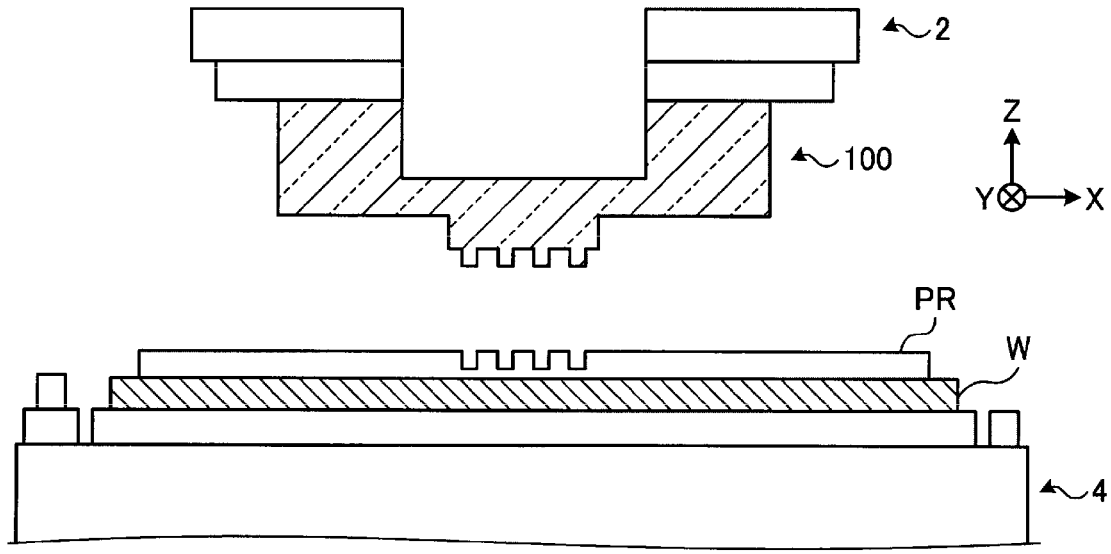

The control device 11 controls each portion of the imprint device 1. The imprint device 1 performs control as shown, for example, in FIGS. 3 to 5 by the control device 11. FIG. 3 is a flowchart showing an operation of the imprint device 1. FIGS. 4 and 5 are views showing operations of the imprint device 1.

The imprint device 1 sets a condition on a control amount of magnification adjustment (S1). For example, in a state where the electromagnetic wave generation source 61 is disposed in the vicinity of the bottom surface 104b of the opening 104 of the template 100, the imprint device 1 changes the control amount from the control device 11, and measures the magnification at which the pedestal portion 103 changes from an original size thereof. The control amount to be changed by the control device 11 may apply to the electric power supplied from the power source 7 to the electromagnetic wave generation source 61, the distance from the electromagnetic wave generation source 61 to the bottom surface 104b of the opening 104, or the like. According to a measurement result, the imprint device 1 can calculate a correlation between the control amount of the control device 11 and the magnification of the pedestal portion 103, and store the correlation information on the calculated correlation in a storage unit 11a in the control device 11.

When the substrate W to be processed is carried in, the control device 11 acquires recipe information on a processing condition of the substrate W, such as, by receiving from a host controller (not shown) via a communication line. Based on the recipe information, the control device 11 determines the processing condition of the substrate W to be processed (S2). The substrate W includes a plurality of shot regions. The recipe information may include positions of the shot regions, the magnification of the template, a supply amount of the photosensitive material or the like in a form of being associated respectively with identification information of the substrate W and identification information of the shot regions in the substrate W. Accordingly, the processing condition of the substrate W determined at S2 includes the positions of the shot regions, the magnification of the template, the supply amount of the photosensitive material or the like.

When the processing condition of the substrate W is determined, the original stage 2 and the substrate stage 4 are shifted towards each other in the X direction and brought to a state where the substrate stage 4 is not disposed in the −Z direction of the original stage 2, and the control device 11, for example, simultaneously perform the processes of S3 and S4 and the processes of S5 and S6. However, either one of the processes may be performed first.

As shown in part (a) of FIG. 4, the template 100 is held on the original stage 2 by the control device 11 (S3).

Then, the control device 11 adjusts the magnification of the template 100 with reference to the correlation information stored in the storage unit 11a according to the magnification determined in S2 (S4).

That is, as shown in part (b) of FIG. 4, the control device 11 disposes, by the operation unit 8, the magnification adjustment unit 6 at a position corresponding to the pedestal portion 103 on the back surface 100b side of the template 100 (that is, a position in the vicinity of the bottom surface 104b in the opening 104) without contacting the template 100. According to the correlation information, the control device 11 can control the distance from the magnification adjustment unit 6 (electromagnetic wave generation source 61) to the bottom surface 104b of the opening 104 to a distance corresponding to the magnification to be adjusted to.

As shown in part (c) of FIG. 4, the electric power is supplied from the power supply 7 to the magnification adjustment unit 6 and electromagnetic waves are applied from the magnification adjustment unit 6 (electromagnetic wave generation source 61) to the pedestal portion 103 under the control of the control device 11. The control device 11 can control the electric power supplied from the power supply 7 to the magnification adjustment unit 6 to electric power corresponding to the magnification to be adjusted to according to the correlation information. Accordingly, the magnification adjustment unit 6 radially heats the pedestal portion 103 of the template 100, and adjusts the magnification of the pedestal portion 103 by thermal deformation.

Concurrently with the above, the substrate W is held by the substrate stage 4 (S5), and the photosensitive material PR is supplied onto the substrate W by a dropping device (not shown) or a coating device (not shown) (S6) under the control of the control device 11. The dropping device drops droplets of the photosensitive material PR onto the substrate W by an inkjet method or the like. The coating device applies the photosensitive material PR on the substrate W by a spin coating method or the like.

When it is confirmed that the magnification adjustment (S4) and the supply of the photosensitive material PR (S6) are both completed, the control device 11 adjusts the relative positions of the original stage 2 and the substrate stage 4 such that the substrate stage 4 is located in the −Z direction relative to the original stage 2. Further, as shown in part (d) of FIG. 4, the control device 11 performs position alignment such that the shot region to be processed on the substrate W is located in the −Z direction with respect to the pedestal portion 103, such as by using an alignment mark disposed around the shot region on the substrate W. When the alignment is completed, the control device 11 adjusts the original stage 2 and the substrate stage 4 so as to approach each other in the Z direction, and presses the pedestal portion 103 of the template 100 against the photosensitive material PR on the substrate W (S7).

Meanwhile, during the period from the completion of S4 to the completion of S7, the control device 11 makes the magnification adjustment unit 6 (electromagnetic wave generation source 61) retract from the opening 104 by the operation unit 8 (S12). For example, the control device 11 pulls up the electromagnetic wave generation source 61 in the +Z direction and moves the electromagnetic wave generation source 61 to a position (for example, a position shown by a broken line in FIG. 2 or a position shown in part (d) of FIG. 4) outside the opening 104 of the template 100 without overlapping the pedestal portion 103 when viewed from the Z direction.

As shown in part (a) of FIG. 5, the control device 11 places, by means of the operation unit 10, the light source 9 in a position in the vicinity of the opening 104 in the template 100 (for example, a position in the vicinity of the lower end of the region surrounded by the dashed-dotted line in FIG. 1). The control device 11 supplies electric power to the power source 9 and irradiates the photosensitive material PR on the substrate W with exposure light from the power source 9 via the template 100, thereby photocuring the photosensitive material PR (S8).

As shown in part (b) of FIG. 5, the control device 11 adjusts such that the original stage 2 and the substrate stage 4 move away from each other in the Z direction and the pedestal portion 103 of the template 100 is released from the photosensitive material PR on the substrate W (S9).

When the release (S9) is completed, the control device 11 determines whether or not there is another shot region to be processed on the substrate W (S10). If there is another shot region to be processed (Yes in S10), the control device 11 selects the shot region and returns the process to S2. If there is no another shot region to be processed (No in S10), the control device 11 determines whether or not there is another substrate W to be processed (S11). If there is another substrate W to be processed (Yes in S11), the control device 11 carries another substrate W onto the substrate stage 4, and returns the process to S2. If there is no another substrate W to be processed (No in S11), the control device 11 ends the process.

By implementing S2 to S11, the imprint device 1 can effectively adjust the magnification of the template 100 for each shot region of each substrate W so as to perform imprint process.

As described above, in the imprint device 1 of the first embodiment, the magnification adjustment unit 6 is disposed at a position corresponding to the pattern of the pedestal portion 103 on the back surface 100b side of the template 100 without contacting the template 100, and the pedestal portion 103 is thermally deformed by radiation heat from the magnification adjustment unit 6. When the template 100 includes the opening 104 on the back surface 100b side, the imprint device 1 may have the magnification adjustment unit 6 disposed in a non-contact manner in the vicinity of the bottom surface 104b of the opening 104. Accordingly, since the pedestal portion 103 can be substantially uniformly heated from a position close to the magnification adjustment unit 6, the adjustment range of the magnification of the template 100 can be readily expanded, and the adjustment time can be readily shortened. Therefore, since the magnification of the template 100 can be stably and quickly adjusted to a desired magnification, the yield can be improved and the manufacturing cost can be reduced in the manufacture of semiconductor devices.

In addition, in the first embodiment, the imprint device 1 can effectively adjust the magnification of the template 100 for each shot region of each substrate W so as to perform imprint process. Accordingly, variations in magnification between substrates can be corrected with high precision when a plurality of substrates W are imprinted successively.

In the first embodiment, the magnification adjustment (S4) is performed before the pressing (S7). Accordingly, since the template 100 is radially heated in a state where the template 100 and the substrate W are not in contact with each other, desired magnification control can be performed on the template 100 while the change in the temperature of the substrate W is kept low.

In the first embodiment, the magnification adjustment unit 6 is retracted (S12) after the magnification adjustment (S4). Accordingly, exposure light and alignment light can be prevented from being intercepted by the magnification adjustment unit 6.

FIG. 3 illustrates a case where the magnification of the template 100 is adjusted for each shot region of each substrate W. Alternatively, the magnification of the template 100 may be adjusted to a different value according to a cycle period of the imprinting process (for example, the total times of the pressing (S7)), or may be adjusted to a different value according to the total time from the start of the imprinting process.

Figure 6:
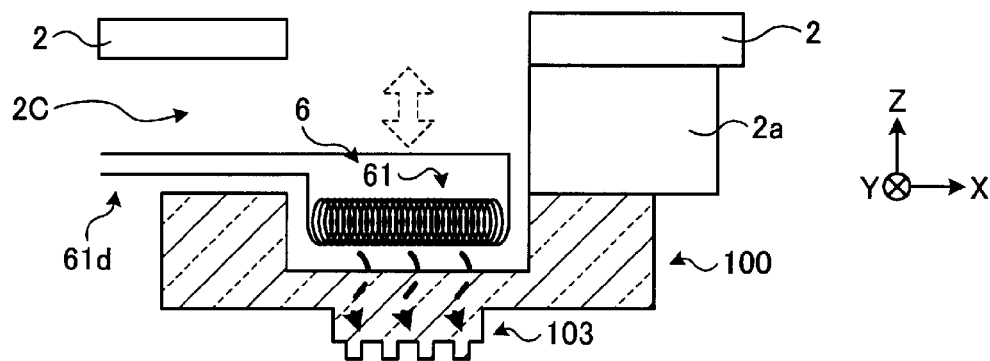
FIG. 6 is a view showing an operation of the imprint device according to a modification of the first embodiment.
Figure 6:
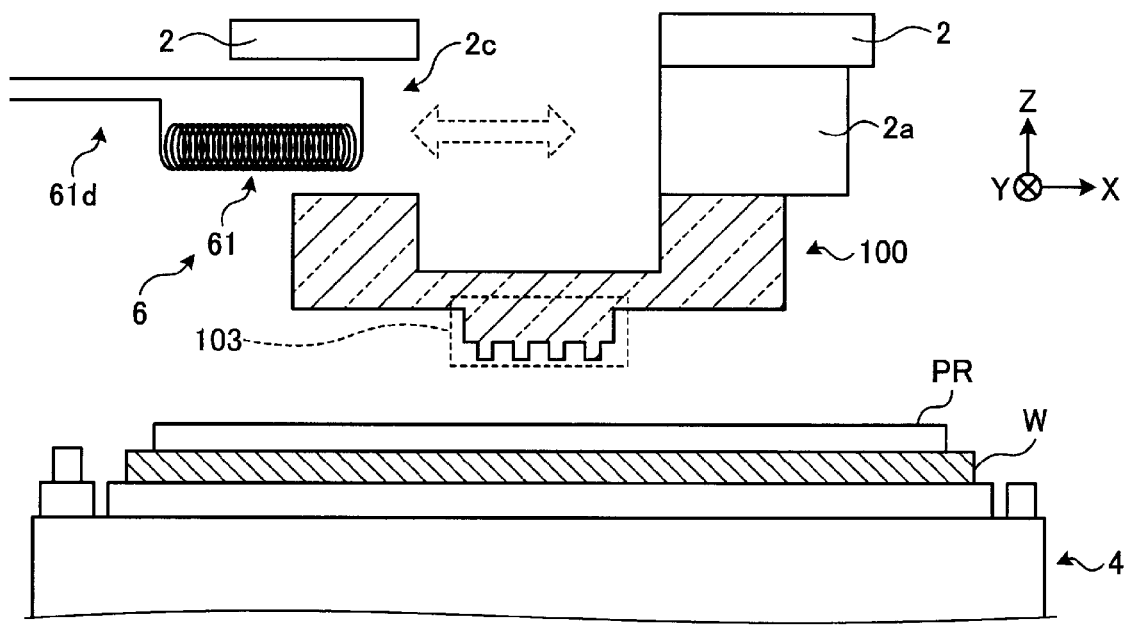

Alternatively, FIG. 4 illustrates a case where the magnification adjustment unit 6 (electromagnetic wave generation source 61) is pulled up in the +Z direction so as to be retracted from the opening 104 of template 100, but as shown in FIG. 6, the magnification adjustment unit 6 (electromagnetic wave generation source 61) may be moved in the −X direction so as to be retracted from the opening 104 of the template 100. For example, the original stage 2 shown in part (a) of FIG. 6 includes a side opening 2c. The electromagnetic wave generation source 61 is supported via a grip portion 61d which extends in the X direction to pass through the side opening 2c as shown by a broken line arrow. The control device 11 moves the electromagnetic wave generation source 61 in the −Z direction via the grip portion 61d and can dispose the electromagnetic wave generation source 61 in the vicinity of the bottom surface 104b of the opening 104. The electric power is supplied from the power supply 7 to the magnification adjustment unit 6 by the control device 11, and electromagnetic waves are applied from the magnification adjustment unit 6 (electromagnetic wave generation source 61) to the pedestal portion 103. Thereafter, the control device 11 moves the electromagnetic wave generation source 61 in the +Z direction and then moves the electromagnetic wave generation source 61 in the −X direction, and thus the electromagnetic wave generation source 61 is retracted from the opening 104 of the template 100. Accordingly, the exposure light and alignment light can be prevented from being intercepted by the magnification adjustment unit 6.

Figure 7:
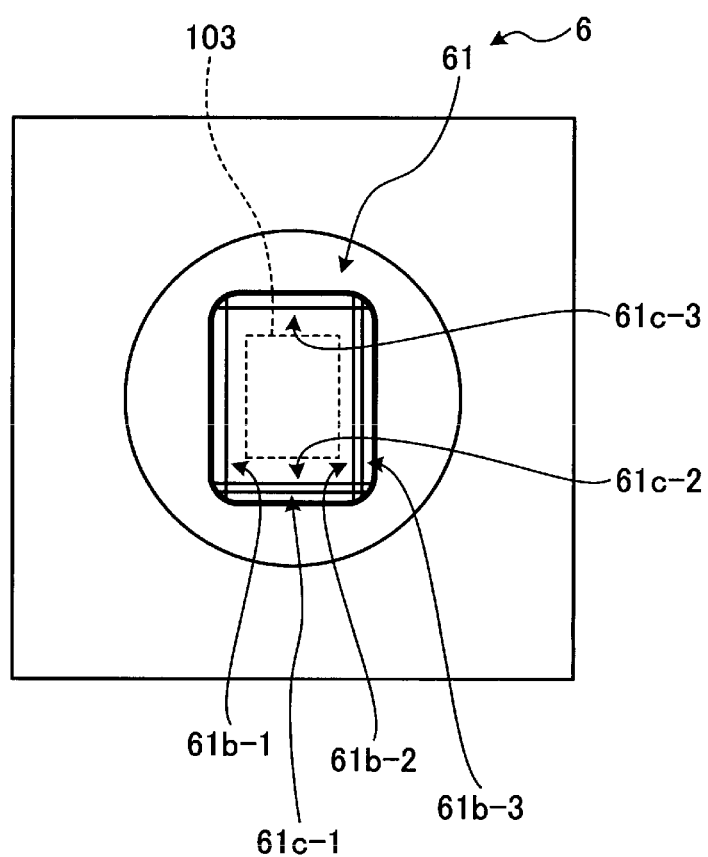
FIG. 7 is a view showing a planar configuration of a magnification adjustment unit according to another modification of the first embodiment.
Figure 7:
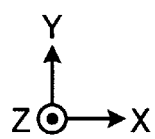

Alternatively, as shown in FIG. 7, the electromagnetic wave generation source 61 in the magnification adjustment unit 6 is configured such that the plurality of heating wires 61$b$-1 to 61$b$-3 is movable in the X direction, and may be configured such that the plurality of heating wires 61$c$-1 to 61$c$-3 is movable in the Y direction. FIG. 7 is a view showing a planar configuration of the magnification adjustment unit 6 in a modification of the embodiment.

In this case, the control device 11 causes the operation unit 8 to change the magnification adjustment unit 6 (electromagnetic wave generation source 61) from a state of being retracted to a position not overlapping the pattern of the pedestal portion 103 when seeing through the opening 104 from the Z direction to a state of being disposed at a position corresponding to (e.g., disposed above) the pattern of the pedestal position 103 in the opening 104 in S4 shown in FIG. 3. Accordingly, similarly with in the first embodiment, the pedestal portion 103 can be thermally deformed by radiation heat from the magnification adjustment unit 6.

In S12 shown in FIG. 3, the control device 11 causes the operation unit 8 to change the magnification adjustment unit 6 (electromagnetic wave generation source 61) from a state of being disposed at a position corresponding to the pattern of the pedestal position 103 in the opening 104 to a state of being retracted to a position not overlapping the pattern of the pedestal portion 103 when seeing through the opening 104 from the Z direction. Accordingly, the exposure light and alignment light can be prevented from being intercepted by the magnification adjustment unit 6 without retracting the magnification adjustment unit 6 from the opening 104.

Figure 8:
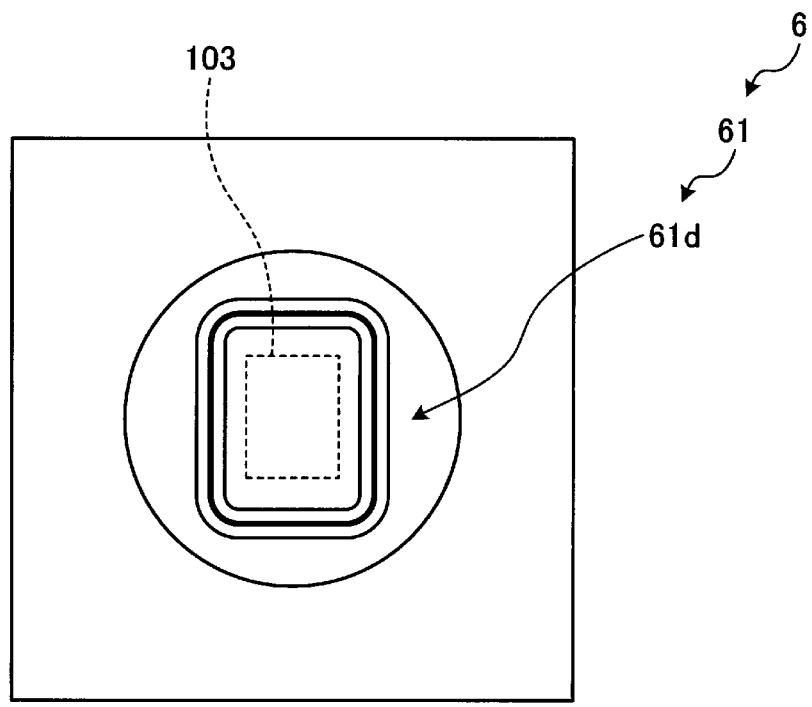
FIG. 8 is a view showing a planar configuration of the magnification adjustment unit according to still another modification of the first embodiment.

Alternatively, as shown in FIG. 8, the pattern of the heating wire 61$d$ may be configured not to overlap the pattern of the pedestal portion 103. FIG. 8 is a view showing a planar configuration of the magnification adjustment unit 6 in another modification of the embodiment. In this case, it is not necessary to retract the magnification adjustment unit 6 (electromagnetic wave generation source 61) outside the optical path because so as not to block the optical path. Therefore, the operation unit 8 of the imprint device 1 may be omitted, and S12 may be omitted in the method shown in FIG. 3. In FIG. 8, the wirings 7$a$ and 7$b$ are not shown for the sake of simplifying the illustration.

Second Embodiment

Next, an imprint device 201 according to a second embodiment will be described. Hereinafter, the description will focus mainly on configurations of the second embodiments that differ from those of the first embodiment.

In the first embodiment, the magnification adjustment of the template 100 in a non-contact manner is performed using radiation heat generated by application of electromagnetic waves from the magnification adjustment unit 6. In the second embodiment, the magnification adjustment of the template 100 is performed using indirect heat conduction by intentional temperature regulation of the air on the back surface 100$b$ side of the template 100.

Figure 9:
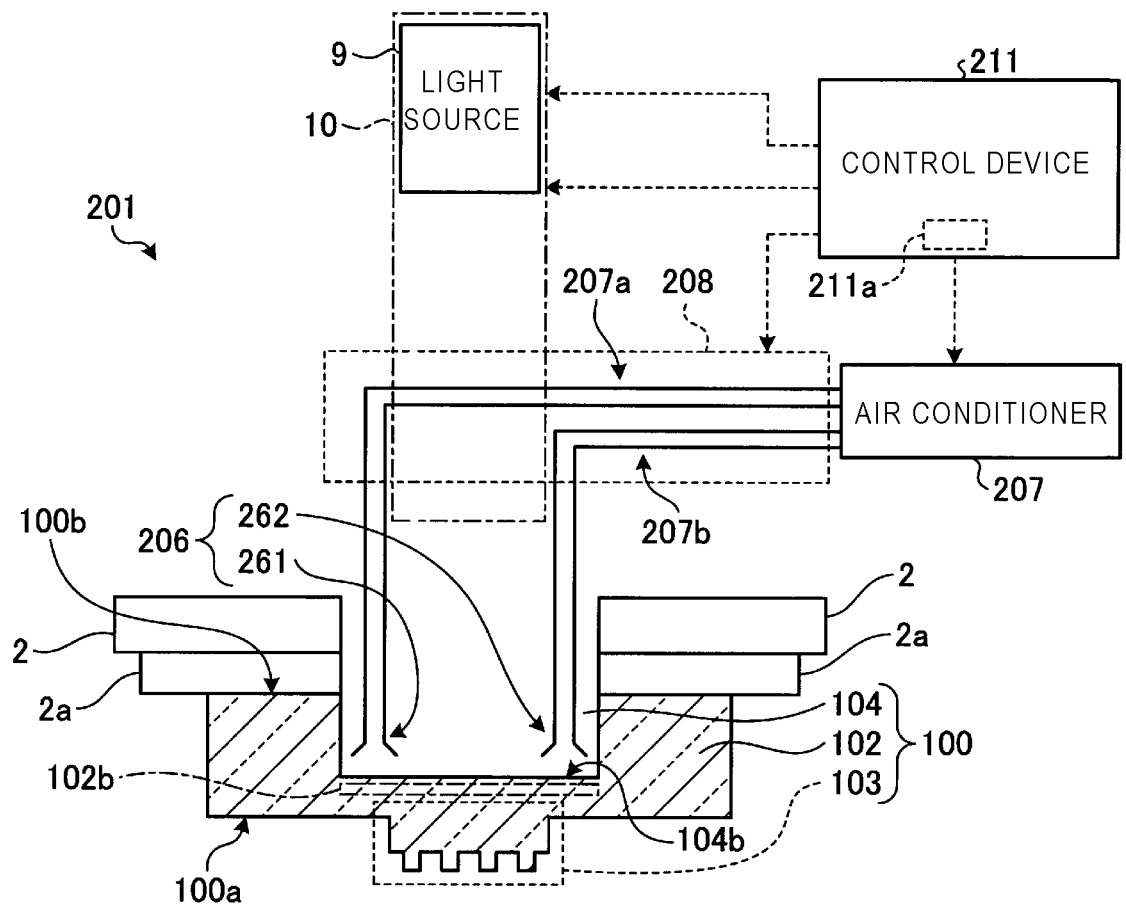
FIG. 9 is a view showing a configuration of an imprint device according to a second embodiment.
Figure 9:
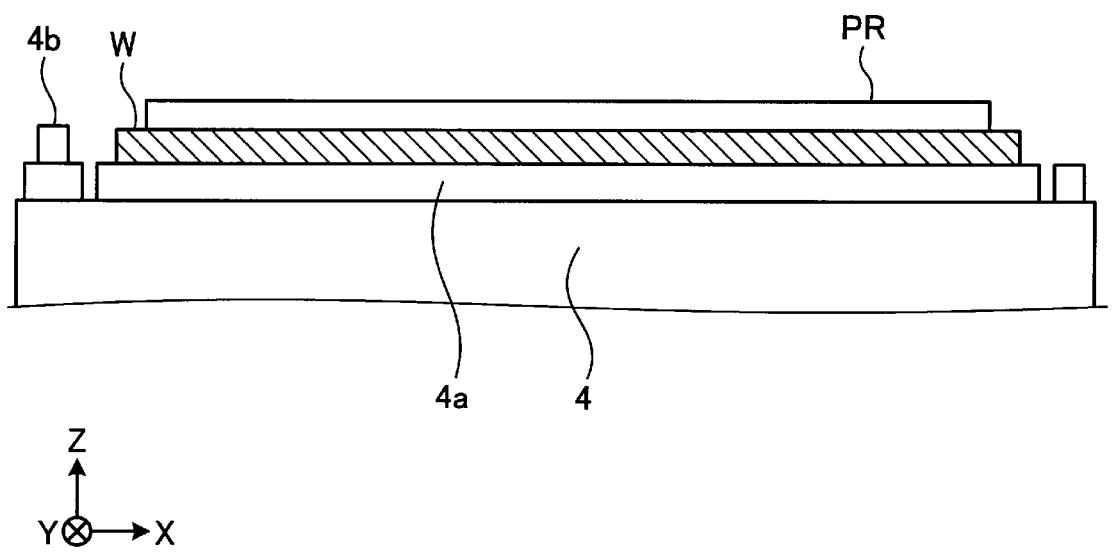

The imprint device 201 may be configured as shown in FIG. 9. FIG. 9 is a view showing a configuration of the imprint device 201. The imprint device 201 includes a magnification adjustment unit 206, an air conditioner 207, an operation unit 208 and a control device 211 instead of the magnification adjustment unit 6, the power supply 7, the operation unit 8 and the control device 11 (see FIG. 1).

The magnification adjustment unit 206 includes outlets 261 and 262 through which air from the air conditioner 207 is blown to the vicinity of the bottom surface 104$b$ of the opening 104. The air conditioner 207 includes a heat exchanger, a refrigerant circuit which causes refrigerant to pass through the heat exchanger, and a fan which causes air to pass through the vicinity of the heat exchanger. The air conditioner 207 causes the air sucked from a suction port (not shown) to pass through the vicinity of the heat exchanger by the fan, so as to exchange heat between the heat exchanger and the air and generate conditioned air whose temperature is regulated. The air conditioner 207 can supply the conditioned air to the outlets 261 and 262 via the air-conditioning pipes 207$a$ and 207$b$. For example, the air conditioner 207 supplies the conditioned air to the outlets 261 and 262 in a state (first state) where the outlets 261 and 262 are disposed in a non-contact manner in the vicinity of the bottom surface 104$b$ of the opening 104. Accordingly, the conditioned air blown out from the outlets 261 and 262 is blown to the bottom surface 104$b$ of the opening 104, and a region 102$b$ of the bottom surface 104$b$ in the template main body 102 is heated or cooled by the conditioned air. As a result, the pedestal portion 103 is deformed by being heated or cooled, and the magnification of the template 100 can be adjusted.

The operation unit 208 switches between a first state and a second state. The first state is a state where the magnification adjustment unit 206 is disposed at a position corresponding to the pattern of the pedestal portion 103 in the opening 104. The position corresponding to the pattern of the pedestal portion 103 in the opening 104 can be, for example, a position in the vicinity of the bottom surface 104$b$ without contacting the template 100. The second state is a state where the magnification adjustment unit 206 is retracted from the opening 104.

For example, the operation unit 208 moves the outlets 261 and 262 in the XY direction up to an upward position on the +Z side of the template 100, and can switch to the first state by pushing down the outlets 261 and 262 in the −Z direction via the air-conditioning pipes 207$a$ and 207$b$ to move the outlets 261 and 262 to the positions in the vicinity of the bottom surface 104$b$ in the opening 104 of the template 100 without contacting the template 100. When the outlets 261 and 262 are disposed at the positions in the vicinity of the bottom surface 104$b$ in the opening 104 of the template 100 without contacting the template 100, the operation unit 208 can switch to the second state by pulling up the outlets 261 and 262 in the +Z direction via the air-conditioning pipes 207$a$ and 207$b$ to move the outlets 261 and 262 in the XY direction to positions (for example, at the right end position shown by a broken line) outside the opening 104 of the template 100 without overlapping the pedestal portion 103 when viewed from the Z direction. By switching to the second state, it is possible to expose the substrate W and observe an alignment mark via the template 100.

The imprint device 201 can perform operations similar to those in FIG. 3. For example, in the condition setting (S1) on the control amount of the magnification adjustment, in the state where the outlets 261 and 262 are disposed in the vicinity of the bottom surface 104$b$ of the opening 104 of the template 100, the imprint device 201 changes the control amount from the control device 211, and measures the magnification at which the pedestal portion 103 changes from the original size. The control amount to be changed by the control device 211 may relate to a temperature of the conditioned air adjusted by the air conditioner 207, an air volume of the conditioned air supplied from the air conditioner 207 to the outlets 261 and 262 (e.g., a rotation speed of the fan), a distance from the outlets 261 and 262 to the bottom surface 104*b* of the opening 104, or the like. According to the measurement result, the imprint device 201 can calculate a correlation between the control amount of the control device 211 and the magnification of the pedestal portion 103, and store the correlation information on the calculated correlation in a storage unit 211*a* in the control device 211.

For example, the control device 211 adjusts the magnification of the template 100 with reference to the correlation information stored in the storage unit 211*a* according to the magnification determined in S2 (S4).

That is, the control device 211 places, by means of the operation unit 208, the magnification adjustment unit 206 in a position corresponding to the pedestal portion 103 on the back surface 100*b* side of the template 100 (that is, a position in the vicinity of the bottom surface 104*b* in the opening 104) without contacting the template 100. According to the correlation information, the control device 211 can control the distance from the magnification adjustment unit 206 (outlets 261 and 262) to the bottom surface 104*b* of the opening 104 to a distance corresponding to the magnification to be adjusted to.

The control device 211 controls the air conditioner 207 to blow out the conditioned air which is regulated by the air conditioner 207 to a temperature corresponding to the magnification determined in S2, to the bottom surface 104*b* of the opening 104 from the outlets 261 and 262 at an air volume corresponding to the magnification determined in S2. The pedestal portion 103 is heated or cooled by indirect heat conduction via the conditioned air, and the magnification of the pedestal portion 103 is adjusted by deformation in response to the indirect heat conduction. Specifically, the pedestal portion 103 may be deformed by deformation in an expansion direction during heating and by deformation in a contraction direction during cooling.

In addition, during a period from the completion of S4 to the completion of S7, the control device 211 retracts the magnification adjustment unit 206 (outlets 261 and 262) from the opening 104 by the operation unit 208 (S12). For example, the control device 211 pulls up the outlets 261 and 262 in the +Z direction via the air-conditioning pipes 207*a* and 207*b* and moves the outlets 261 and 262 in the XY direction to a position outside the opening 104 of the template 100 without overlapping the pedestal portion 103 when viewed from the Z direction.

As described above, in the imprint device 201 of the second embodiment, the outlets 261 and 262 of the air conditioner 207 are disposed at the positions corresponding to the pattern of the pedestal portion 103 on the back surface 100*b* side of the template 100 without contacting the template 100 (that is, positions in the vicinity of the bottom surface 104*b* of the opening 104), and the conditioned air whose temperature is regulated is blown out from the outlets 261 and 262 to the bottom surface 104*b* of the opening 104. Since the indirect heat conduction via the conditioned air allows heating or cooling substantially uniformly from positions close to the pedestal portion 103, the adjustment range of the magnification of the template 100 can be readily expanded, and the adjustment time can be readily shortened. Therefore, the yield can be readily improved and the manufacturing cost can be readily reduced in the manufacture of semiconductor devices.

Third Embodiment

Next, an imprint device 301 according to a third embodiment will be described. Hereinafter, the description will focus mainly on configurations of the third embodiments that differ from those of the first embodiment and the second embodiment.

In the third embodiment, where features of the first embodiment and the second embodiment are combined, the template 100 magnification adjustment in a non-contact manner is performed by combining the radiation heating by electromagnetic wave application from the magnification adjustment unit 306 and the indirect heat conduction by intentional temperature regulation of the air on the back surface 100*b* side of the template 100.

Figure 10:
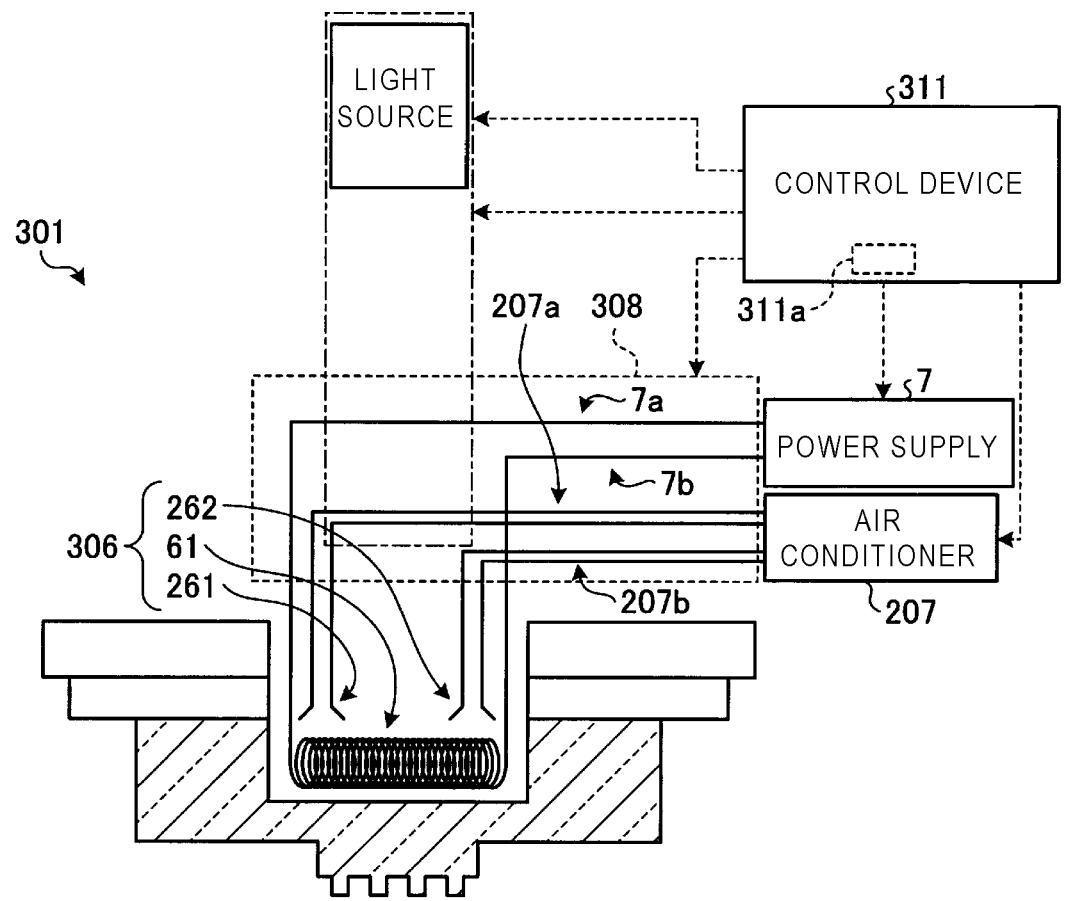
FIG. 10 is a view showing a configuration of an imprint device according to a third embodiment.
Figure 10:
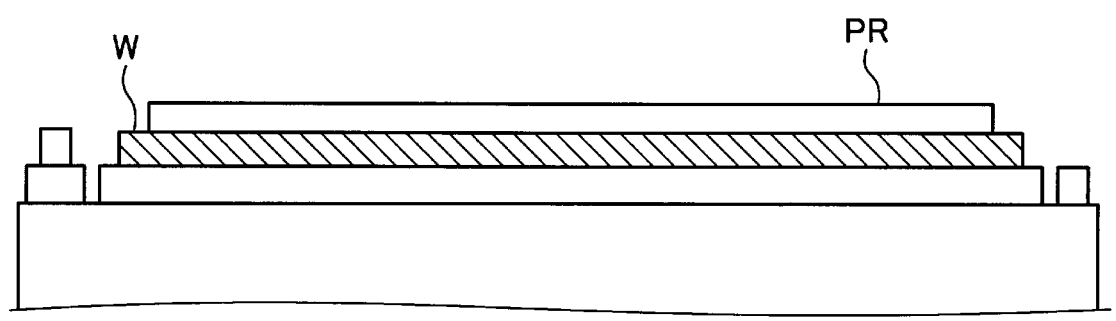

The imprint device 301 may be configured as shown in FIG. 10. FIG. 9 is a view showing a configuration of the imprint device 201. The imprint device 201 includes a magnification adjustment unit 306, an operation unit 308 and a control device 311 instead of the magnification adjustment unit 6, the operation unit 8 and the control device 11 (see FIG. 1), and further includes the air conditioner 207.

The magnification adjustment unit 306 includes the electromagnetic wave generation source 61 and the outlets 261 and 262. The configuration and operation of the electromagnetic wave generation source 61 are similar to those in the first embodiment. The configuration and operation of the outlets 261 and 262 are similar to those in the second embodiment. Further, the configuration and operation of the air conditioner 207 are similar to those in the second embodiment.

The operation unit 308 can switch between a first state and a second state respectively for the electromagnetic wave generation source 61 and the outlets 261 and 262. The first state is a state where the magnification adjustment unit 306 is disposed at a position corresponding to the pattern of the pedestal section 103 in the opening 104. The position corresponding to the pattern of the pedestal portion 103 in the opening 104 may be, for example, a position in the vicinity of the bottom surface 104*b* without contacting the template 100. The second state is a state where the magnification adjustment unit 306 is retracted from the opening 104.

The control device 311 performs condition setting (S1) on an control amount of magnification adjustment respectively for the electromagnetic wave generation source 61 and the outlets 261 and 262, and the correlation information on the correlation between the control amount of the control device 311 and the magnification of the pedestal portion 103 may be stored and held in a storage unit 311*a* in the control device 311.

As described above, in the imprint device 301 of the third embodiment, the magnification adjustment unit 306 includes the electromagnetic wave generation source 61 and the outlets 261 and 262. Accordingly, the pedestal portion 103 can be deformed in an expansion direction by radiation heat from the electromagnetic wave generation source 61, and can be deformed in an expansion direction and a contraction direction by indirect heat conduction via the conditioned air, whose temperature is regulated, from the outlets 261 and 262 of the air conditioner 207. Accordingly, the adjustment range of the magnification of the template 100 can be further expanded.

Fourth Embodiment

Next, an imprint device 401 according to a fourth embodiment will be described. Hereinafter, the description will focus mainly on configurations of the fourth embodiments that differ from those of the first embodiment to the third embodiment.

In the fourth embodiment, the magnification adjustment of the template 100 in a non-contact manner and the magnification adjustment of the template 100 in a contact manner are combined.

Similarly with the first embodiment, the magnification adjustment of the template 100 in the non-contact manner can be performed by radiation heating by electromagnetic wave application from the magnification adjustment unit 6. The magnification adjustment of the template 100 in the contact manner can be performed by pressing a side surface 100c of the template 100 with a magnification adjustment unit 412.

Figure 11:
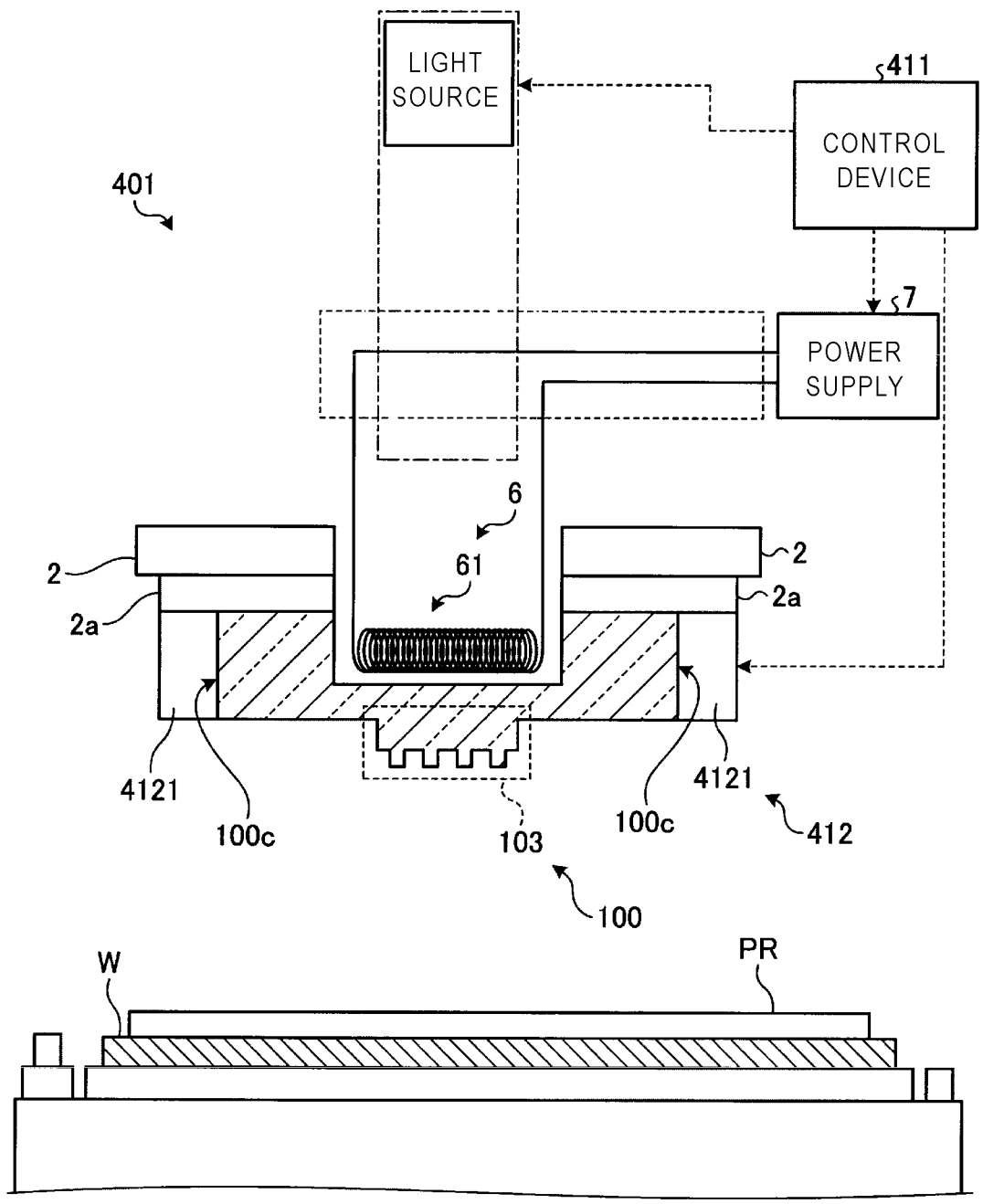
FIG. 11 is a view showing a configuration of an imprint device according to a fourth embodiment.

The imprint device 401 may be configured as shown in FIG. 11. FIG. 11 is a view showing a configuration of the imprint device 401. The imprint device 401 includes a control device 411 instead of the control device 11 (see FIG. 1), and further includes the magnification adjustment unit 412. The magnification adjustment unit 412 may be disposed on the −Z side of the original stage 2, for example, on the bottom side of the original chuck 2a. The magnification adjustment unit 412 includes an actuator and a plurality of pressing members 4121 operated by the actuator.

Figure 12:
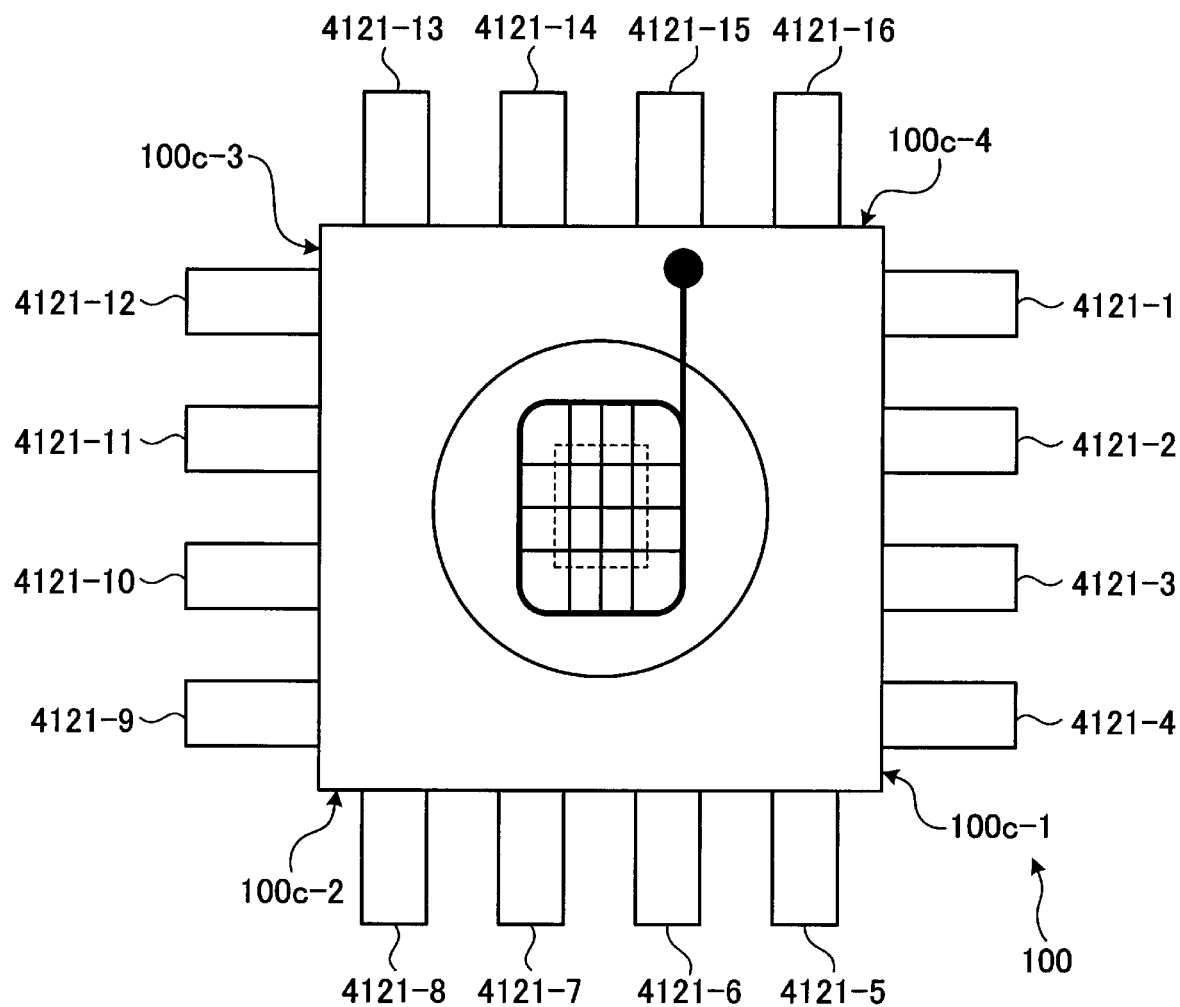
FIG. 12 is a view showing a configuration of a template and a magnification adjustment unit according to the fourth embodiment.

For example, as shown in FIG. 12, the magnification adjustment unit 412 includes a plurality of pressing members 4121-1 to 4121-16 corresponding to four side surfaces 100c-1 to 100c-4 of the template 100. The control device 411 may control the magnification adjustment unit 412 to press the side surface 100c-1 on the +X side of the template 100 in the −X direction by the plurality of pressing members 4121-1 to 4121-4. The plurality of pressing members 4121-5 to 4121-8 may press the side surface 100c-2 on the −Y side of the template 100 in the +Y direction. The plurality of pressing members 4121-9 to 4121-12 may press the side surface 100c-3 on the −X side of the template 100 in the +X direction. The plurality of pressing members 4121-13 to 4121-16 may press the side surface 100c-4 on the +Y side of the template 100 in the −Y direction.

Therefore, in the imprint device 401 of the fourth embodiment, the magnification of the template 100 can be adjusted by a combination of radiation heating by electromagnetic wave application from the magnification adjustment unit 6 to the pedestal portion 103 and pressing of the side surfaces 100c of the template 100 by the magnification adjustment unit 412. That is, according to the magnification to be adjusted to, the pedestal portion 103 can be deformed in the expansion direction and the contraction direction. Accordingly, the adjustment range of the magnification of the template 100 can be further expanded.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An imprint device, comprising: a template which has a first surface and a second surface opposite to the first surface, and is provided with a pedestal portion on the first surface, the pedestal portion defining a pattern; a holding portion configured to hold the template; and a magnification adjustment unit disposed at a position corresponding to the pattern of the pedestal portion on a second surface side of the template without contacting the template; wherein the magnification adjustment unit comprises an electromagnetic wave generation source that includes: a frame; a plurality of heating wires; and a grip option configured to be gripped by the operation unit.

2. The imprint device according to claim 1,
wherein the template defines an opening on the second surface thereof, and
the magnification adjustment unit is disposed completely within the opening without contacting a bottom surface of the opening.

3. The imprint device according to claim 2,
wherein the magnification adjustment unit includes an electromagnetic wave generation source which is configured to generate electromagnetic waves with a wavelength longer than visible light.

4. The imprint device according to claim 2, further comprising an air conditioner,
wherein the magnification adjustment unit includes an outlet through which air from the air conditioner is blown toward the bottom surface of the opening.

5. The imprint device according to claim 2, further comprising:
an operation unit which is configured to switch between a first state where the magnification adjustment unit is disposed at a position corresponding to the pattern of the pedestal portion in the opening and a second state where the magnification adjustment unit is retracted from the opening.

6. The imprint device according to claim 2, further comprising:
an operation unit which is configured to switch between a first state where the magnification adjustment unit is disposed at a position overlapping the pattern of the pedestal portion when viewed through the opening from a direction perpendicular to the first surface, and a second state where the magnification adjustment unit is retracted to a position not overlapping the pattern of the pedestal portion when viewed through the opening from the direction perpendicular to the first surface.

7. An imprint method, comprising: holding a template which has a first surface and a second surface opposite to the first surface and is provided with a pedestal portion defining a pattern on the first surface; disposing a magnification adjustment unit at a position corresponding to the pedestal portion on a second surface side of the template without contacting the template; and adjusting a magnification of the pedestal portion using the magnification adjustment unit; wherein the magnification adjustment unit comprises an electromagnetic wave generation source that includes: a frame; a plurality of heating wires; and a grip portion configured to be gripped by the operation unit.

8. The method according to claim 7,
wherein the template defines an opening on the second surface thereof, and
disposing the magnification adjustment unit comprises disposing the magnification adjustment unit completely within the opening without contacting a bottom surface of the opening.

9. The method according to claim 8, further comprising generating electromagnetic waves with a wavelength longer than visible light using the magnification adjustment unit.

10. The method according to claim 8, wherein the magnification adjustment unit includes an outlet, the method further comprising blowing air from an air conditioner through the outlet towards the bottom surface of the opening.

11. The method according to claim 8, further comprising using an operation unit to switch between a first state where the magnification adjustment unit is disposed at a position corresponding to the pattern of the pedestal portion in the opening and a second state where the magnification adjustment unit is retracted from the opening.

12. The method according to claim 8, further comprising using an operation unit to switch between a first state where the magnification adjustment unit is disposed at a position overlapping the pattern of the pedestal portion when viewed through the opening from a direction perpendicular to the first surface, and a second state where the magnification adjustment unit is retracted to a position not overlapping the pattern of the pedestal portion when viewed through the opening from the direction perpendicular to the first surface.

13. A method of manufacturing a semiconductor device, comprising:
supplying a photosensitive material onto a substrate;
adjusting magnification of a pedestal portion of a template by the imprint method according to claim 7;
pressing the adjusted pedestal portion of the template against the photosensitive material on the substrate;
curing the photosensitive material; and
releasing the template from the cured photosensitive material.

14. An imprint device, comprising: a template which has a first surface and a second surface opposite to the first surface, and is provided with a pedestal portion on the first surface, the pedestal portion defining a pattern; a magnification adjustment unit; and an operation unit configured to grip the template and to position the template at a position corresponding to the pattern of the pedestal portion on a second surface side of the template without contacting the magnification adjustment unit; wherein the magnification adjustment unit comprises an electromagnetic wave generation source that includes: a frame; a plurality of heating wires; and a grip portion configured to be gripped by the operation unit.

15. The imprint device of claim 14 further comprising: a power supply connected to the magnification adjustment unit by wirings; and a light source.

16. The imprint device of claim 15, wherein the operation unit is configured to switch between a first state wherein the light source is retracted to a position that does not contact the wirings, and a second state wherein the light source positioned between the wirings and the template.

17. A method of manufacturing a semiconductor device, comprising:
supplying a photosensitive material onto a substrate;
adjusting magnification of a pedestal portion of a template using the imprint device of claim 14;
pressing the adjusted pedestal portion of the template against the photosensitive material on the substrate;
curing the photosensitive material; and
releasing the template from the cured photosensitive material.

18. The method of claim 17, further comprising setting a control amount of magnification adjustment for the magnification adjustment unit.

19. The method of claim 18, wherein the control amount relates to at least one of an electric power supplied from a power source to an electromagnetic wave generation source of the magnification adjustment unit, and a distance from the electromagnetic wave generation source to a bottom surface of an opening of the template.

20. The imprint device of claim 14, wherein the magnification adjustment unit is configured to move in a vertical direction against the template.

21. The imprint device of claim 14, wherein the magnification adjustment unit is configured to move in a horizontal direction against the template.

* * * * *